United States Patent [19]
Allan

[11] Patent Number: 4,581,546
[45] Date of Patent: Apr. 8, 1986

[54] CMOS SUBSTRATE BIAS GENERATOR HAVING ONLY P CHANNEL TRANSISTORS IN THE CHARGE PUMP

[75] Inventor: James D. Allan, Colorado Springs, Colo.

[73] Assignee: Inmos Corporation, Colorado Springs, Colo.

[21] Appl. No.: 547,971

[22] Filed: Nov. 2, 1983

[51] Int. Cl.[4] ........................ H03K 3/354; G05F 1/56
[52] U.S. Cl. ................................. 307/297; 307/296 R
[58] Field of Search .................... 307/296 R, 297, 304

[56] References Cited

U.S. PATENT DOCUMENTS

| | | | |
|---|---|---|---|
| 4,208,595 | 6/1980 | Gladstein et al. | 307/297 |
| 4,229,667 | 10/1980 | Heimbigner et al. | 307/297 |
| 4,233,672 | 11/1980 | Suzuki et al. | 357/42 X |
| 4,283,642 | 8/1981 | Green | 307/297 |
| 4,307,333 | 12/1981 | Hargrove | 307/297 X |
| 4,336,466 | 6/1982 | Sud et al. | 307/297 |
| 4,439,692 | 3/1984 | Beekmans et al. | 307/304 X |
| 4,455,493 | 6/1984 | Morton et al. | 307/304 X |

FOREIGN PATENT DOCUMENTS

| | | | |
|---|---|---|---|
| 0062894 | 10/1982 | European Pat. Off. | 307/296 R |
| 0066974 | 12/1982 | European Pat. Off. . | |
| 0068842 | 5/1983 | European Pat. Off. . | |
| WO84/00262 | 1/1984 | PCT Int'l Appl. . | |
| 2111336 | 6/1983 | United Kingdom . | |

OTHER PUBLICATIONS

Chang, "Substrate Voltage Sensitivity Detector", IBM Tech. Disc. Bull., vol. 21, No. 1, Jun. 1978, pp. 257–258.
Harroun, "Substrate Bias Voltage Control", IBM Tech. Disc. Bull., vol. 22, No. 7, Dec. 1979, pp. 2691–2692.
L. Arzubi, E. Baier, P. Knott and W. Loehlein; "High Performance, Low Power Voltage Doubler"; IBM Technical Disclosure Bulletin, vol. 23, No. 10, Mar. 1981; pp. 4522–4524.
S. C. Chen and S. Park; "Feedback Substrate Bias Generator"; IBM Technical Disclosure Bulletin, vol. 23, No. 5, Oct. 1980; pp. 1930 and 1931.

*Primary Examiner*—Stanley D. Miller
*Assistant Examiner*—D. R. Hudspeth
*Attorney, Agent, or Firm*—Edward D. Manzo; Roger R. Wise

[57] ABSTRACT

A CMOS substrate bias generator including a PMOS charge pump and a regulator for controlling the operation of the substrate bias generator. The substrate bias generator further includes an input circuit, a reference circuit to provide a reference voltage, a comparison circuit to compare voltage levels between the input and the reference circuit, and output circuitry to provide a signal from the comparison circuitry to the substrate bias generator. The comparison circuitry further includes hysteresis circuitry tending to preserve voltage at a node in the comparison circuit despite an imbalance between the input circuit and the reference circuit.

21 Claims, 9 Drawing Figures

CMOS SUBSTRATE BIAS GENERATOR HAVING ONLY P CHANNEL TRANSISTORS IN THE CHARGE PUMP

BACKGROUND OF THE INVENTION

The present invention is concerned with CMOS semiconductor technology and has as its primary object the provision of a CMOS substrate bias generator. A substrate bias on a CMOS circuit gives better control over thresholds, improves the speed of the circuitry, and guards against negative gliches to control latch-up.

A further object of the present invention is to provide a CMOS substrate bias generator using only P channel transistors in the charge pump thereof.

A further object is to provide a CMOS substrate bias generator which minimizes electron injection from nodes which swing to a negative voltage, for such electron injection can cause loss of capacitively stored data in a dynamic RAM, for example, which can be sensitive to this.

Still a further object of the present invention is to provide a CMOS generator which eliminates first order dependence on process parameters.

Another object of the present invention is to provide a substrate bias generator which can be used in any CMOS memory circuit or CMOS microprocessor circuit which uses N channel transistors operating with a negative substrate.

SUMMARY OF THE INVENTION

According to one aspect of the invention, a CMOS charge pump is provided using no N channel transistors. In another aspect of the invention, such charge pump is combined with a ring oscillator, logic circuits for generating drive signals for the charge pump, and a regulator coupled to the substrate and the logic circuits.

In a more detailed aspect of the invention, there is provided a charge pump having a first node coupled to an output. An oscillating signal is received and is coupled to this first node. A second node and supporting circuitry control a device coupled to the first node so that the voltage on the first node can be driven down. Further circuitry selectively couples the first node to the output.

In other aspects of this invention, the regulator circuit for a CMOS charge pump includes an input circuit, a reference circuit, a comparator between them, and a hysteresis circuit regulator. Circuitry is provided in another aspect of the invention so that first order effects are eliminated.

BRIEF DESCRIPTION OF THE DRAWINGS

In describing the preferred embodiment of the invention, reference is made to drawings wherein like reference numerals designate like elements, and wherein.

In these figures a P channel device is signified by a small circle attached to the gate of a transistor.

DESCRIPTION OF THE PREFERRED EMBODIMENT

A. The Charge Pump

Figure 1:
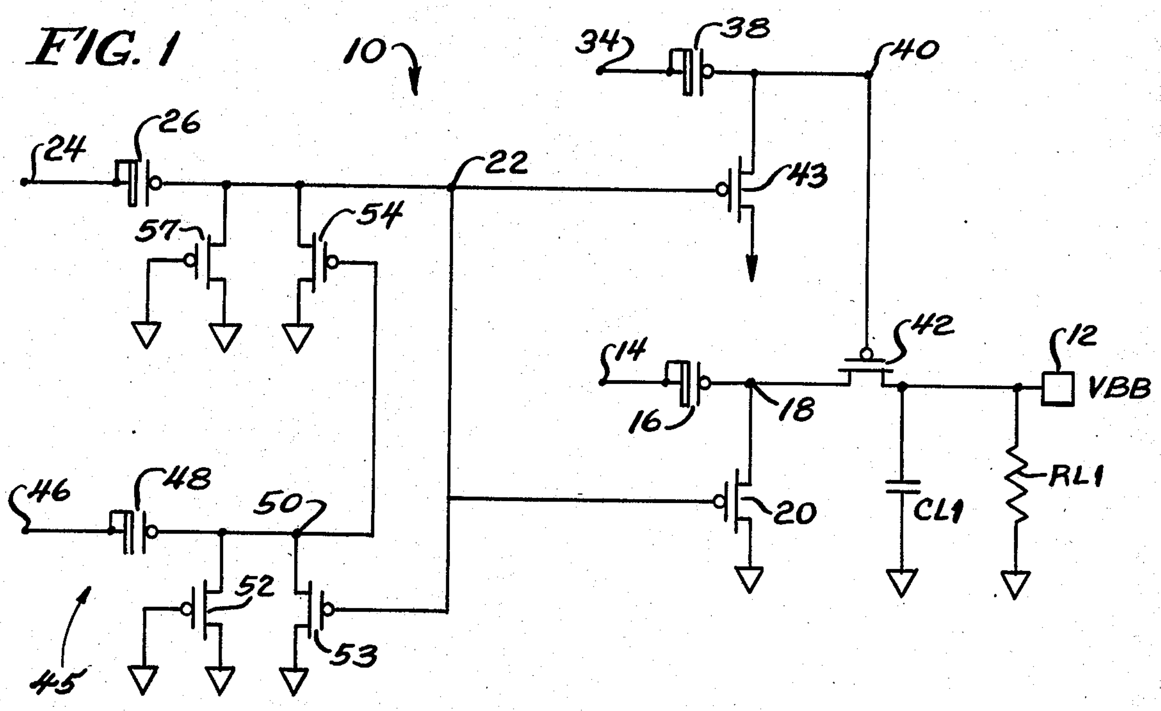
FIG. 1 schematically illustrates a CMOS charge pump according to certain aspects of the invention.
Figure 2:
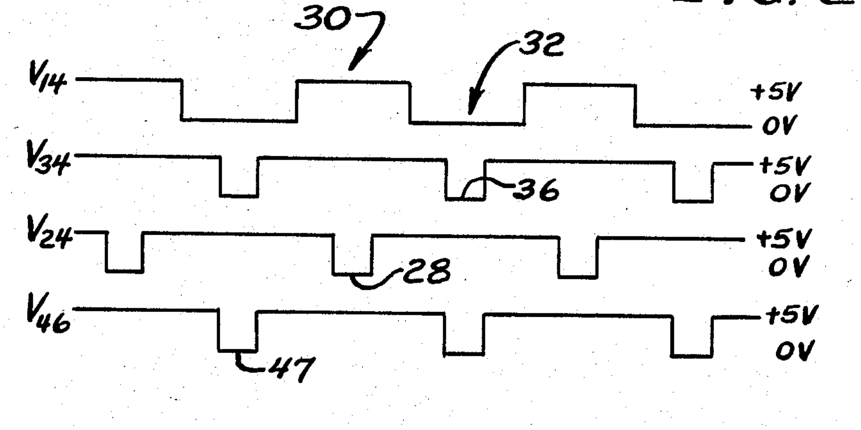
FIG. 2 is a set of waveforms received by the circuit of FIG. 1.
Figure 4A:
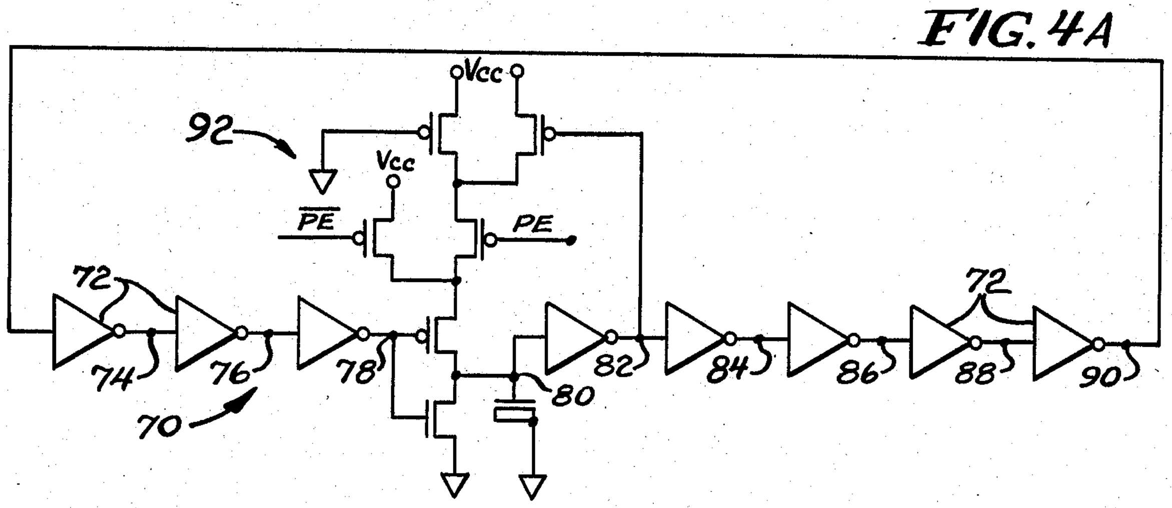
FIG. 4 shows a set of circuits for generating the input signals to the charge pump circuit of FIG. 1.
Figure 3:
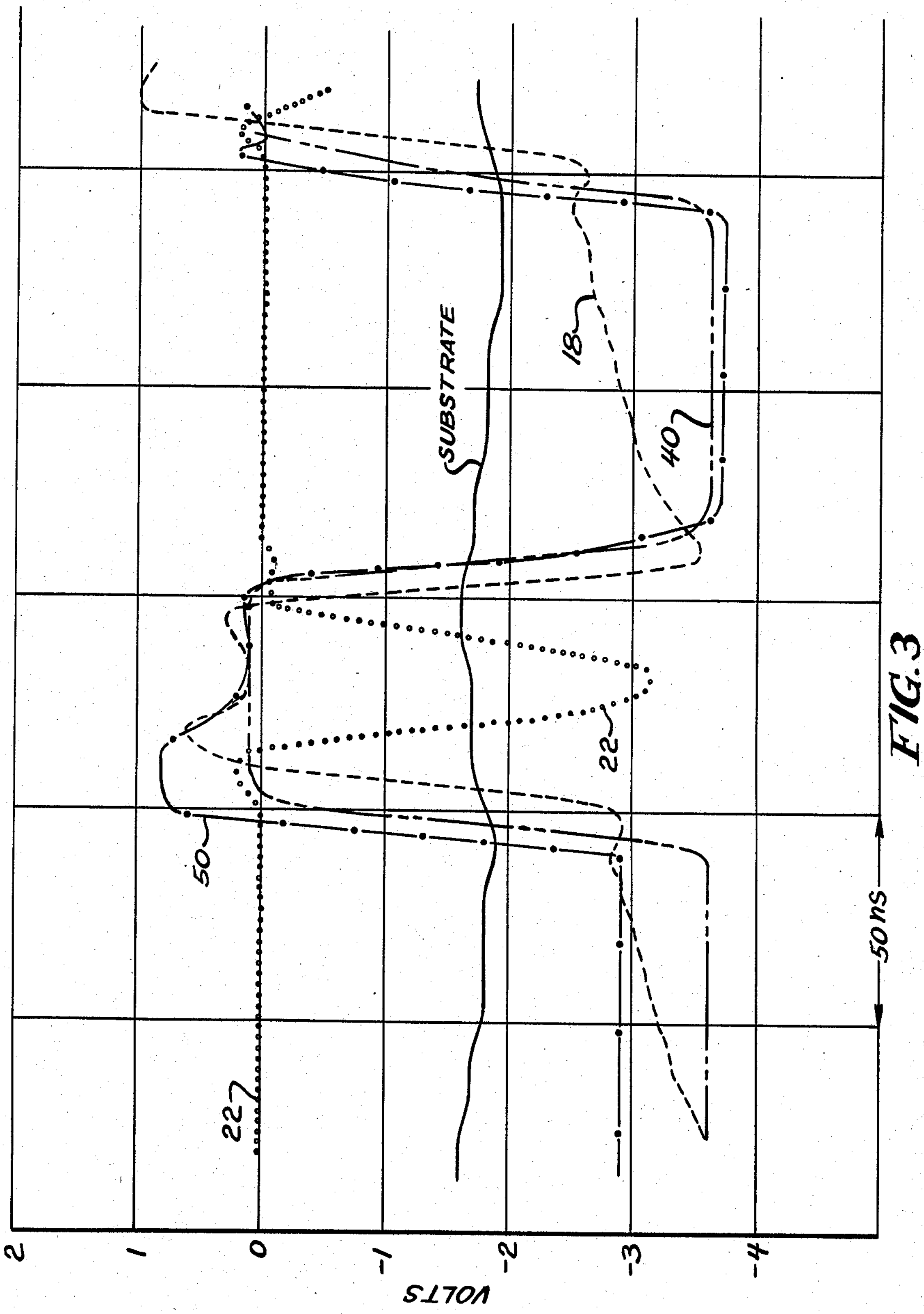
FIG. 3 is a set of waveforms to show the operation of the circuit of FIG. 1, and particularly the modes 18, 22, 40 and 50, and the substrate voltage.
Figure 4B:
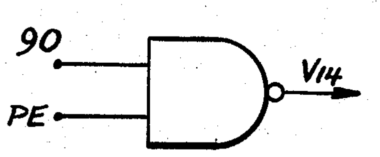
Figure 4C:
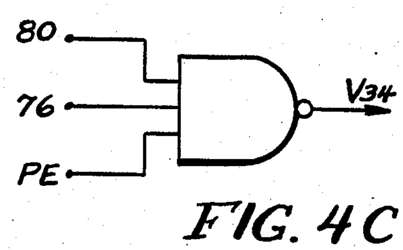
Figure 4D:
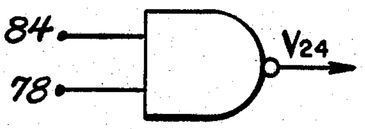
Figure 4E:
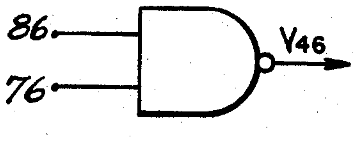

The accompanying figures illustrate a preferred embodiment of circuits according to various aspects of the present invention together with waveforms which are useful in comprehending the operation of the circuit. FIG. 1 schematically illustrates a charge pump for a substrate bias generator. It will be seen that circuit 10 includes transistors which are only P channel. Circuit 10 receives four oscillating input signals whose waveforms are illustrated in FIG. 2. The circuitry of FIG. 1 cooperates with the waveforms of FIG. 2 to provide a VBB signal at an output 12 of circuit 10. In describing circuit 10, reference will be made to various elements thereof together with reference to the waveforms illustrated in FIG. 2.

An input 14 receives waveform V14 which for illustrative purposes is a square wave oscillating between 0 volts and ±5 volts (VCC) having a 50% duty cycle. Waveform V14 is applied to capacitor 16, and a node 18 on the other side of capacitor 16 follows waveform V14. It is intended that node 18 should be between 0 volts and −VCC (−5 volts). At at time when waveform V14 is at 5 volts, node 18 is clamped to ground via the source-drain path of transistor 20 whose on resistance may be as low as twenty ohms.

The gate of transistor 20 is coupled to a node 22. An input 24 to circuit 10 receives a waveform V24 and capacitively couples it to node 22 via capacitor 26. Thus, node 22 follows waveform V24.

Waveform V24 contains a portion 28 at 0 volts. The voltage at node 22 is caused to drop to −5 volts during portion 28 of waveform V24. As can be seen in FIG. 2, this occurs when waveform V14 is at a positive level 30. As a result of the timing of waveform V24, and specifically its portion 28, transistor 20 turns on to clamp node 18 to ground. Then, when waveform V14 goes from +5 volts to 0 volts, as shown at portion 32, node 18 correspondingly will be driven down from 0 volts to −5 volts.

Node 18 is selectively coupled to the output 12. During portion 32 of waveform V14, another waveform V34 applied to an input 34 of circuit 10 also drops to 0 volts as shown at 36. Waveform V34 is coupled by a capacitor 38 to a node 40 which is coupled to the gate of a P channel transistor 42. The source-drain path of transistor 42 couples the negative 5 volts at node 18 to output 12. Because of the very large capacity of the substrate, VBB at output 12 will drop only a small amount. Eventually, VBB will reach approximately −VCC/2.

It will be understood that the voltage at node 40 will be caused to vary in steady state operation between −5 volts and 0 volts as a result of the clamping effect of a transistor 43. Its gate is controlled by the voltage at node 22. Due to the phase separation between waveforms V24 and V34, node 40 will be clamped to ground at times when V34 is high, and when V34 drops low, that will drive node 40 negative by a voltage swing of five volts, in much the same manner as the operation of other nodes discussed herein and shown in charge pump 10.

In operation, waveform V24 starts at VCC. When it drops to 0 volts, the voltage at node 22 drops negative and this turns on transistor 20. During this voltage drop, waveform V14 is high, and so node 18 is at its own highest voltage. Accordingly, as a result of the transition to 0 volts in waveform V24, node 18 is grounded. It will be released when V24 goes high. Shortly thereafter, waveform V14 drops from VCC down to 0 volts as a result of portion 32 in waveform V14. This drives node 18 to −VCC. Next, this negative voltage is coupled to output 12 as a result of a portion 36 of waveform V34. Thus, waveforms V14, V24 and V34 are applied in circuit 10 to develop a negative voltage at output 12.

Those who are skilled in the art will appreciate that transistors 20 and 42 will both be off when a transition occurs on waveform 14. This promotes speed. It is also to be appreciated that while node 18 is low, a signal gates transistor 42 to couple node 18 to output 12. In this embodiment, a low going portion of waveform V34 is used advantageously for this, although other circuitry can be substituted. Moreover, it is to be appreciated that when node 18 is high, a signal is used to cause clamping to ground. In particular, this is a low going portion of waveform V24, although substitutions can be made.

Circuit 10 includes further elements shown in FIG. 1 which perform a standby or initialization function. It will be understood that when VBB reaches a certain level, charge pump 10 will stop pumping. If VBB rises, standby circuitry 45 ensures that pump 10 will be ready for use. This is done by ensuring that nodes 18 and 22 are at ground potential. Standby circuit 45 includes an input 46 which receives a waveform V46 which is illustrated in FIG. 2. This waveform includes a portion 47 at zero volts. A capacitor 48 couples input 46 to a node 50. When oscillations start in waveform V46 during power-up, transistor 52 clamps capacitor 48 to a P channel threshold voltage. During such power-up, the clamp has to be at a P channel threshold, and after power-up, the clamp can be to ground.

After power-up, node 50 is coupled selectively to ground by the source-drain path of a transistor 53 whose gate is controlled by the signal at node 22. There is a phase difference between the signals V24 and V46 applied to inputs 24 and 46, respectively, and this phase difference causes transistor 53 to clamp node 50 to ground at some time. Thereafter, due to the timing of portion 47, the voltage at node 50 will be driven negative when the clamp (transistor 53) is released.

At some time when node 22 is high, the voltage at node 50 will drop to negative, and a transistor 54 will turn on because its gate is coupled to node 50. This clamps node 22 to ground, in the manner discussed already, whereby the voltage range at node 22 will be between 0 volts and −5 volts, instead of, for example, between −3 volts and +2 volts (because if the voltage at node 22 goes to a positive potential, it will be coupled to ground by the source-drain path of transistor 54). Similarly, the voltage at node 50 is kept between 0 volts and −5 volts through the action of transistor 53.

It should be mentioned that the source-drain path of a transistor 57 couples node 22 to ground. Also, its gate is grounded. The effect of this transistor is that during power-up, when oscillations shown in waveform V14 commence, transistor 57 clamps capacitor 26 to a positive excursion of the magnitude of VTP, which is a P channel threshold of about 1.5 volts.

Also shown in FIG. 1 are a capacitance CL1 and a resistance RL1. These are representative of the substrate.

It will be noted that all of the nodes of the charge pump are located inside N wells and are not connected to the substrate or to N channel transistors. Hence, none of these nodes can inject electrons into the substrate. This prevents loss of signal from capacitively charged nodes.

The capacitors 16, 26, 38 and 48 can be P channel devices, but they are preferably N channel depletion types. This has the advantage of preventing substrate bouncing with the well voltages. The use of N channel device here is acceptable because no N diffusions go negative in the FIG. 1 circuitry.

B. The Input Signal Generators

The waveforms V14, V24, V34 and V46 are generated in circuitry schematically and illustratively shown in FIG. 4 which is a collection of schematic diagrams. The basic element of FIG. 4 is illustratively shown in FIG. 4A and includes a ring oscillator 70 having eight stages of inverters 72 connected in series to form nine nodes 74, 76, 78, 80, 82, 84, 86, 88 and 90. Such circuits are very well known and those ordinarily skilled in the art who need no further explanation to construct circuit 70. Suffice it to say that the voltages between adjacent nodes in the ring oscillator are cyclic and have a phase separation.

Further circuitry 92 is provided between node 78 and, for the most part, node 80, although one gate is coupled to node 82. Circuitry 92 is used to slow the frequency when the bias generator is not pumping, that is, when the pump enable signal PE is O. This technique is known to the art and needs no further explanation. The PE signal is developed in the regulator circuit described infra.

The waveforms V14, V34, V24, V46, coupled respectively to inputs 14, 34, 24 and 46 (FIG. 1), are generated in the circuits of FIGS. 4B, 4C, 4D and 4E. These are all NAND circuits coupled to the pump enable signal PE and to the nodes of circuit 70. The NAND circuits avoid ever having floating nodes.

From considering FIG. 4, it will be understood that when the pump enable signal is off (at 0 volts), voltages V14 and V34 are stable at VCC, whereas waveforms V24 and V46 oscillate as shown in FIG. 2.

C. The Regulator Circuit

Figure 5:
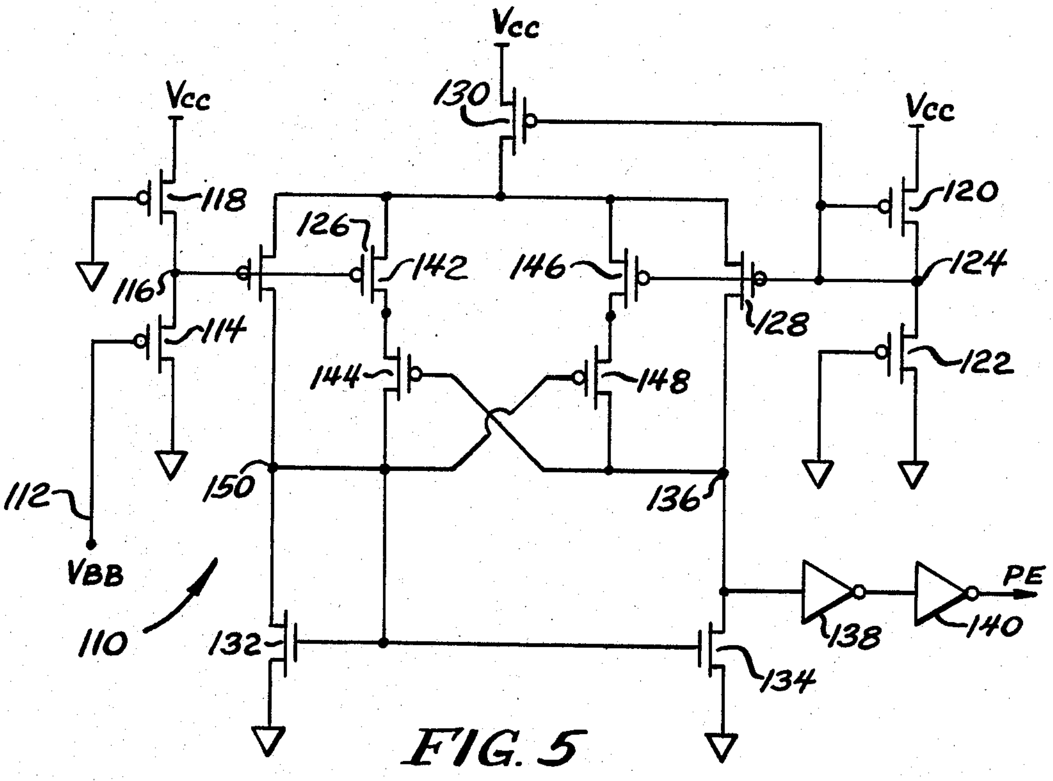
FIG. 5 schematically shows a regulator circuit for use in combination with the charge pump shown in FIG. 1.

The pump enable signal PE is generated by a regulator circuit 110 shown in FIG. 5. It will be seen that this circuit has a pair of nodes on opposing sides of a differential amplifier which is modified to include hysteresis circuitry. Circuit 110 seeks to regulate the substrate voltage VBB to −VCC/2 which is about −2.5 volts.

Starting at the left side of this schematic circuit 110 receives the substrate voltage VBB at an input 112 and applies this to a gate of a transistor 114. A node 116 is formed at the junction of the source of transistor 114 with the drain of another transistor 118, whose gate is grounded. Both transistors 114 and 118 are P channel transistors, as are most of the transistors in circuit 110. The voltage at node 116 will naturally go to VCC/2 and hence the bias on transistors 114 and 118 will be equal. When node 116 is at VCC/2 transistors 114 and 118 will be on because their drain to source potentials are −VCC/2 and their gate to source potentials both are −VCC. As VBB goes more negative, the gate to source potential of transistor 114 increases, and node 116 moves toward ground. This method of sensing VBB does not draw any current from the substrate.

At the right side of circuit 110, a pair of transistors 120 and 122 have their source-drain paths connected in series to couple VCC to ground. A node 124 is located schematically between two transistors 120 and 122. Both transistors are on; the drain to source potential is −VCC/2 and the gate to source potential is also −VCC/2. Thus, unlike node 116, which is dependent on VBB being negative, the voltage at node 124 is dependent of VBB. Node 124 therefore always is at a voltage of VCC/2.

The middle portion of circuit 110 in general compares the voltage at node 116 to node 124 and generates the pump enable signal PE as a result of the comparison. If the VBB voltage is greater than −VCC/2, then node 116 will have a voltage greater than the voltage at node 124. On the other hand, if VBB is smaller than −VCC/2, then node 116 will have a (positive) voltage smaller than the voltage at node 124. This middle part of the schematic diagram includes a standard CMOS differential amplifier formed between nodes 116 and 124. It includes transistors 126, 128, 130, 132 and 134. Transistors 132 and 134 are N channel transistors, and all of the other transistors have P channels. The gate of transistor 130 is coupled to node 124 which is always at VCC/2 or substantially +2.5 volts. Thus, the current through transistor 130 should be generally constant. The current through transistor 132 plus the current through transistor 134 should always equal the current through transistor 130. The current through transistor 132 is affected by the voltage on transistor 126, which is a function of VBB. Similarly, the current through transistor 134 is affected by the voltage on transistor 128, which generally is not a function of VBB.

Because of the differential amplifier, a small voltage difference between nodes 116 and 124 will cause a large difference in the current between transistors 126 and 128. The current variation causes a voltage variation at a node 136. A pair of inverters 138 and 140 connected in series are coupled to node 136. The output of inverter 140 is the pump enable signal PE. Thus, in respect of the elements described so far, when VBB is high (higher than −VBB/2), the signal PE goes high.

Next, transistors 142, 144, 146 and 148 add hysteresis. This will require a larger charge in VBB in order to turn on the pump enable signal PE. Thus, if the voltage at node 136 is high, and the voltage at a corresponding node 150 is lower than the voltage at node 136, then transistor 148 will turn on. Transistor 146 is always on, so when transistor 148 turns on, it helps node 136 stay high relative to node 150. In the reverse situation, the voltage at node 150 should rise and the voltage at node 136 should drop. However, transistor 148 tends to preserve the voltage at 136 until it is overcome.

D. Conclusions

Thus it is seen that the CMOS substrate bias generator illustrated herein provides an on-chip voltage of −2.5 volts from a power supply of +5 volts. The circuitry according to the preferred embodiment includes a nine stage ring oscillator, logic gates, a charge pump and a voltage regulator, which generate a substrate bias in an efficient manner with a low transistor count.

It will be seen that only P channel transistors are used in the charge pump so that no electron injection will take place from nodes which swing to a negative voltage. Additionally, as the power supply is ramped up, the circuit starts to pump when VCC reaches a level which is close to twice the P channel threshold, thus helping to prevent latch-up. CMOS circuits have previously controlled latch-up by grounding the N channel substrate which has detrimental effect on speed. Thus, the circuit according to the preferred embodiment of the present invention does not suffer this disadvantage.

The regulator circuit illustrated herein maintains the substrate bias at substantially −VCC/2 in a fashion that eliminates first order dependence on process parameters. Substrate bias generators which do not use CMOS circuitry have produced voltages which follow threshold variations. In this embodiment, the regulator design sets the substrate to a level of −VCC/2 independent of any Vtn or other process parameters. This gives a better yield.

The circuits described herein can be used advantageously for biasing a P substrate negative in an N well CMOS design or biasing P wells negative in a P well CMOS design. By exchanging N type and P type devices in the circuits, this generator can be used to bias an N substrate positive in a P well CMOS design, or to bias the N wells positive in an N well CMOS design.

It will be understood that a variety of modifications in the embodiment disclosed herein can be made within the scope of the present invention. For example, the timing can be adjusted. The illustrative embodiment uses a 50% duty cycle on waveform V14. A different duty cycle can be used by increasing the number of stages in the ring oscillator to give added delay to the time that transistor 20 or transistor 42 is on.

Therefore the present disclosure should be taken in an illustrative sense, and that the scope of protection afforded should be defined by the following claims.

What is claimed as the invention is:

1. A substrate bias generator for CMOS semiconductor circuitry having a charge pump to deliver a negative voltage VBB to the substrate, including:
- a first node and an output to the substrate;
- means for receiving a first oscillating signal having transitions between high and low values, said means being coupled to said first node;
- means for coupling said first node to said output;
- first selectively operable means for clamping said first node to a reference level having an on and an off state, said first selectively operable means being in an off state whenever there is a transition in said first oscillating signal;
- a second node coupled to said first means for clamping;
- means coupled to said second node for receiving a second oscillating signal having transitions between high and low values, said second oscillating signal being phase shifted from said first oscillating signal; and
- means for controlling the voltage range at said second node in steady state operation to essentially non-positive voltage.

2. The circuit of claim 1 wherein said means for controlling the voltage range at said second node includes:
- second selectively operable means for clamping said second node to said reference level;
- a third node;
- means for receiving a third oscillating signal coupled to said third node, said third oscillating signal being in phase with said first oscillating signal;

said second means for clamping being responsively coupled to said third node.

3. The circuit of claim 2 wherein said means for controlling further includes:

third selectively operable means for clamping said third node to said reference level, being responsively coupled to said second node.

4. The circuit of claim 3 wherein said means for clamping includes P channel MOS transistors coupled to said means for receiving said second and third oscillating signals.

5. The circuit of claim 2 wherein said means for coupling said first node to said output includes:

a fourth node;

selectively operable means for coupling said first node to said output, being responsively coupled to said fourth node;

means for receiving a fourth oscillating signal, coupled to said fourth node, said fourth oscillating signal being in phase with said first oscillating signal.

6. The circuit of claim 5 further including:

fourth selectively operable means for clamping said fourth node to said reference level;

said fourth means for clamping being responsively coupled to said second node.

7. The circuit of claim 1 wherein said first means for clamping includes no N channel MOS device.

8. The circuit of claim 2 wherein each of said first and second means for clamping includes a P channel MOS device.

9. The circuit of claim 3 wherein each of said first, second and third means for clamping includes no N channel MOS device.

10. The circuit of claim 4 wherein each of said means for clamping includes no N channel MOS device.

11. The circuit of claim 5 wherein each of said means for clamping includes no N channel MOS device.

12. The circuit of claim 6 wherein each of said means for clamping includes no N channel MOS device.

13. The circuit according to claim 1 further including a generator for generating said oscillating signals, said generator including:

a ring oscillator;

first logic means coupled to said oscillator for generating a periodic signal having a first duty cycle, said signal constituting said first oscillating signal; and second logic means coupled to said oscillator for receiving periodic signals therefrom having a phase separation between them, for generating said second oscillating signal having a longer duty cycle than said first oscillating signal, said second oscillating signal being at a high level when said first oscillating signal is at a low level, said second oscillating signal being at a low level at selected times when said first oscillating signal is at a high level.

14. The circuit of claim 2 further including a generator for generating said oscillating signals, said generator including:

a ring oscillator;

first logic means coupled to said oscillator for generating a periodic signal and having a first duty cycle, said signal constituting said first oscillating signal;

second logic means coupled to said oscillator for receiving periodic signals therefrom having a phase separation between them, for generating said second oscillating signal and having a longer duty cycle than said first oscillating signal, said second oscillating signal being at a high level when said first oscillating signal is at a low level, said second oscillating signal being at a low level at selected times when said first oscillating signal is at a high level; and third logic means coupled to receive periodic signals from said oscillator having a phase separation between them, for generating said third oscillating signal having a duty cycle longer than the duty cycle of said first oscillating signal, said third oscillating signal being at a high level at selected times when said first oscillating signal is at a high level and being at a low level at selected times when said first oscillating signal is at a low level.

15. The circuit according to claim 14 wherein said second and third oscillating signals have equal duty cycles and have a phase difference between them of 180°.

16. The circuit according to claim 5 including a generator for generating said oscillating signals, said generator including:

a ring oscillator;

first logic means coupled to said oscillator for generating a periodic signal having voltage levels substantially between 0 volts and VCC and having a first duty cycle, said signal constituting said first oscillating signal;

second logic means coupled to said oscillator for receiving periodic signals therefrom having a phase separation between them, and for generating said second oscillating signal having voltage levels substantially between 0 volts and VCC and having a longer duty cycle than said first oscillating signal, said second oscillating signal being at a high level when said first oscillating signal is at a low level, said second oscillating signal being at a low level at selected times when said first oscillating signal is at a high level; and third logic means coupled to receive periodic signals therefrom having a phase separation between them, and for generating said third oscillating signal having voltage levels substantially between 0 volts and VCC and having a duty cycle longer than the duty cycle of said first oscillating signal, said third oscillating signal being at a high level at selected times when said first oscillating signal is at a high level and being at a low level at selected times when said first oscillating signal is at a low level.

17. The circuit according to claim 16 wherein said second and fourth oscillating signals have equal duty cycles and have a phase difference between them of 180°.

18. A CMOS substrate bias generator including:

a PMOS charge pump;

a regulator for controlling the operation of said substrate bias generator, including:

an input circuit coupled to receive a VBB signal representative of the substrate bias voltage wherein said input circuit develops a voltage at a first node by gating a transistor with said VBB signal to regulate a current flow from VCC to ground;

a reference circuit providing a reference voltage and including a voltage divider coupled to receive a VCC input;

a comparison circuit coupled to said input circuit and to said reference circuit for comparing voltage levels therein; and output means responsively coupled to said comparison circuit to provide a signal to said substrate bias generator.

19. The combination of claim 18 wherein said comparison circuit includes hysteresis circuitry tending to preserve voltage at a node in said comparison circuit despite an imbalance between the signals applied thereto.

20. In combination, a CMOS substrate bias generator;

a regulator for controlling the operation of said substrate bias generator, including:

an input circuit coupled to receive a VBB signal representative of the substrate bias voltage;

a reference circuit providing a reference voltage;

a comparison circuit coupled to said input circuit and to said reference circuit for comparing voltage levels therein; a hysteresis circuit included in said comparison circuit tending to preserve voltage at a node in said comparison circuit despite an imbalance between the signals applied thereto; and output means responsively coupled to said comparison circuit for providing a signal to said substrate bias generator.

21. The combination of claim 20 wherein said input circuit develops a voltage at a first node by gating a transistor with said VBB signal to regulate a current flow from VCC to ground; and wherein said reference circuit includes a voltage divider coupled to receive a VCC input.

* * * * *

UNITED STATES PATENT AND TRADEMARK OFFICE

CERTIFICATE OF CORRECTION

PATENT NO. : 4,581,546

DATED : April 8, 1986

INVENTOR(S) : James D. Allan

It is certified that error appears in the above-identified patent and that said Letters Patent is hereby corrected as shown below:

Col. 2, line 24, "±5" should read --+5--.

Col. 4, line 14, device" should read --devices--; and
line 56, after "schematic" there should be inserted a comma --,--.

Col. 5, lines 11-12, "dependent" should read --independent--.

Signed and Sealed this

*Twenty-third* Day of *September 1986*

[SEAL]

*Attest:*

DONALD J. QUIGG

*Attesting Officer* *Commissioner of Patents and Trademarks*